United States Patent [19]

Sandhu et al.

[11] Patent Number: 5,271,798
[45] Date of Patent: Dec. 21, 1993

[54] METHOD FOR SELECTIVE REMOVAL OF A MATERIAL FROM A WAFER'S ALIGNMENT MARKS

[75] Inventors: Gurtej S. Sandhu; Alan E. Laulusa, both of Boise, Id.

[73] Assignee: Micron Technology, Inc., Boise, Id.

[21] Appl. No.: 39,810

[22] Filed: Mar. 29, 1993

[51] Int. Cl.$^5$ .......................... B44C 1/22; C23F 1/00; C03C 15/00

[52] U.S. Cl. ..................... 156/638; 156/646; 156/656; 156/345

[58] Field of Search ............... 156/637, 638, 639, 626, 156/646, 656, 657, 664, 345; 134/26, 31, 34, 37

[56] References Cited

U.S. PATENT DOCUMENTS

| | | | |
|---|---|---|---|
| 4,992,135 | 2/1991 | Doan | 156/638 X |
| 5,147,499 | 9/1992 | Szwejkowski et al. | 156/657 X |
| 5,223,083 | 6/1993 | Cathey et al. | 156/657 X |
| 5,234,539 | 8/1993 | Schiltz et al. | 156/656 X |

OTHER PUBLICATIONS

"Dual Damascene: A ULSI Wiring Technology" Kaanta et al., pp. 144-152. Jun. 11-12, 1991 VMIC Conference.

*Primary Examiner*—William Powell
*Attorney, Agent, or Firm*—David J. Paul

[57] ABSTRACT

The present invention remedies the problems associated with selective etching of material, and in particular tungsten, by locally removing the material (e.g. tungsten) from the alignment marks through wet etching without the need for any photo steps. Either before or after chemical mechanical polishing, the wafers are flatly aligned and a tungsten etching agent is introduced through an etchant dispensing apparatus onto the alignment marks. Since an alignment mark is normally a few hundred microns in size and there is a large unused silicon real estate around the alignment marks, the alignment constraints vis-a-vis etchant dispensing apparatus and wafer are not very critical and tungsten plugs in the live dice are easily protected from the wet etch. After the etch, the etching byproduct is removed by suction and the wafer is cleaned by being rinsed in distilled water.

26 Claims, 2 Drawing Sheets

METHOD FOR SELECTIVE REMOVAL OF A MATERIAL FROM A WAFER'S ALIGNMENT MARKS

FIELD OF THE INVENTION

This invention relates to semiconductor technology, and more specifically, to a process for locally removing any material, such as a refractory metal, and in particular Tungsten, at the wafer's alignment marks of an in process silicon wafer.

BACKGROUND OF THE INVENTION

Fabrication of multilevel-interconnects in integrated circuits has been greatly enhanced by the use of tungsten (W) as it exhibits excellent resistance to electromigration effects, hillock formation humidity-induced corrosion, and it can be deposited by chemical vapor deposition (CVD). CVD tungsten promotes much better step coverage than do sputter or evaporated films, and selective CVD allows tungsten to fill contact holes and vias that have very high aspect ratios. CVD tungsten also allows unframed vias and contact holes to be implemented which allows greater circuit density on a given semiconductor dice.

Tungsten however, has its disadvantages, and in particular, the difficulties involved with selectively etching tungsten. Since the surface of most CVD tungsten films are fairly rough and tungsten and SiO2 form volatile fluoride by-products, it is difficult to obtain the high selective etching required to remove the unwanted tungsten stringers that remain on the low lying areas of the wafer surface.

Since a blanket tungsten film is deposited everywhere on the dice it must be etched back so that it only remains in the vias or contact holes in order to eliminate the tungsten stringers. Several methods use either a resist or a polyimide sacrificial film to planarize the tungsten. Using these methods requires the sacrificial film to be highly planarized followed by an over-etch to clear all of the tungsten stringers that result from planarization. Due to difficulty in controlling the across wafer uniformity with tungsten etching, over-etching is required. Unfortunately, over-etching can leave over-etched or recessed tungsten plugs and can also cause key-holing in the tungsten plugs. Also, non-uniformity in tungsten thickness across the wafer can result in recessed plugs.

Chemical Mechanical Polishing (CMP) is probably the preferred lower cost method to planarize tungsten films. Still when using CMP on die using fine feature widths, the CMP has its inherent problems. Dishing in large area features and non-uniform polish rate, due to varying feature spatial density top the list. A serious consequence for tungsten CMP is the fact that non-uniform thickness of the tungsten left behind in the alignment marks makes it very difficult to align the wafers at subsequent photo steps.

An article, herein incorporated by reference, entitled "DUAL DAMASCENE: A ULSI WIRING TECHNOLOGY" by Kaanta et al., Jun. 11-12, 1991 VMIC Conference, 1991 IEEE, discusses a new wiring technology that offers a unique process sequence and structure for multiple wiring levels (each with inherent planarity).

The present invention introduces a method for selective etching of a desired material, that proves to be particularly successful in remedying the selective etching of tungsten by removing the tungsten from the alignment marks through wet etching that can be controlled and therefore confined to a specific area on the wafer.

SUMMARY OF THE INVENTION

The present invention describes a process for selectively removing a material from alignment marks on a wafer during a semiconductor fabrication process, using the process steps of:

a) aligning the wafer to an etchant dispensing apparatus at the alignment marks;

b) dispensing a wet etching agent onto the alignment marks, whereby the wet etching agent chemically removes the material;

c) removing etching byproducts resulting from the chemical removal; and d) cleaning the wafer.

Specifically, the present invention remedies the selective etching of tungsten by locally removing the tungsten from the alignment marks through wet etching without the need for any photo steps. Either before tungsten CMP or after, the wafers are flat aligned and tungsten etch solution is introduced through an enclosed etchant dispensing apparatus onto the low lying areas of the wafer surface which result from the alignment marks used for aligning various photolithography mask steps. Since the alignment marks are normally a few hundred microns in size and there is a large unused silicon real estate around the alignment marks, the alignment constraints vis-a-vis enclosed etchant dispensing apparatus and wafer are not too severe and tungsten plugs in the live dice are easily protected from the wet etch. Either during or after the etch, byproducts are removed by suction and the wafers are cleaned by being rinsed in distilled water.

DESCRIPTION OF THE INVENTION

The preferred embodiment of the present invention includes the steps described in FIGS. 1-3 and FIG. 4 shows a general top view showing wafer alignment to a localized etchant dispensing apparatus. Though FIGS. 1-4 show a preferred embodiment, one skilled in the art will appreciate that the present invention provides for removal of any material from a locally confined area of a wafer.

Figure 1:
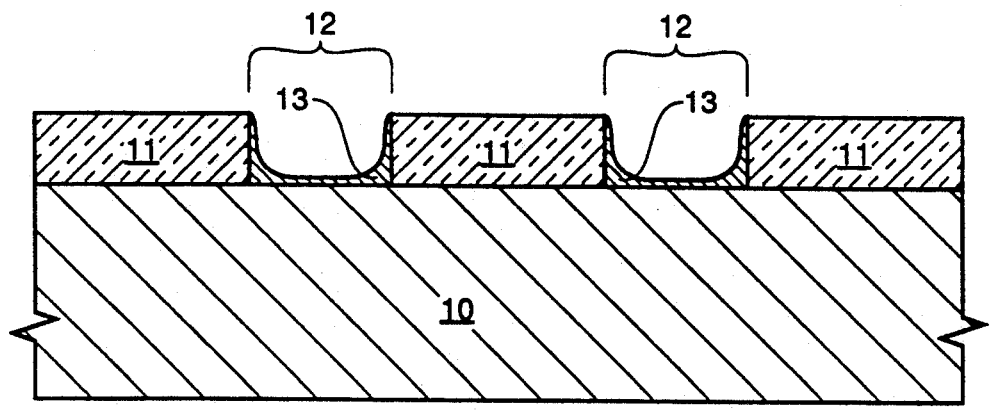
FIGS. 1-3 are cross-sectional views of an in process wafer portion depicting the process steps to implement the present invention.

Referring now to FIG. 1, a silicon wafer 10 has an overlying layer (11) of borophosphosilicate glass (BPSG) in which patterns have been etched thus exposing silicon wafer 10 at alignment marks 12. A refractory metal (tungsten in this case) has been formed, such as by deposition, over the wafer surface and planarized thus leaving behind tungsten residue 13 residing at the alignment marks 12.

Figure 2:
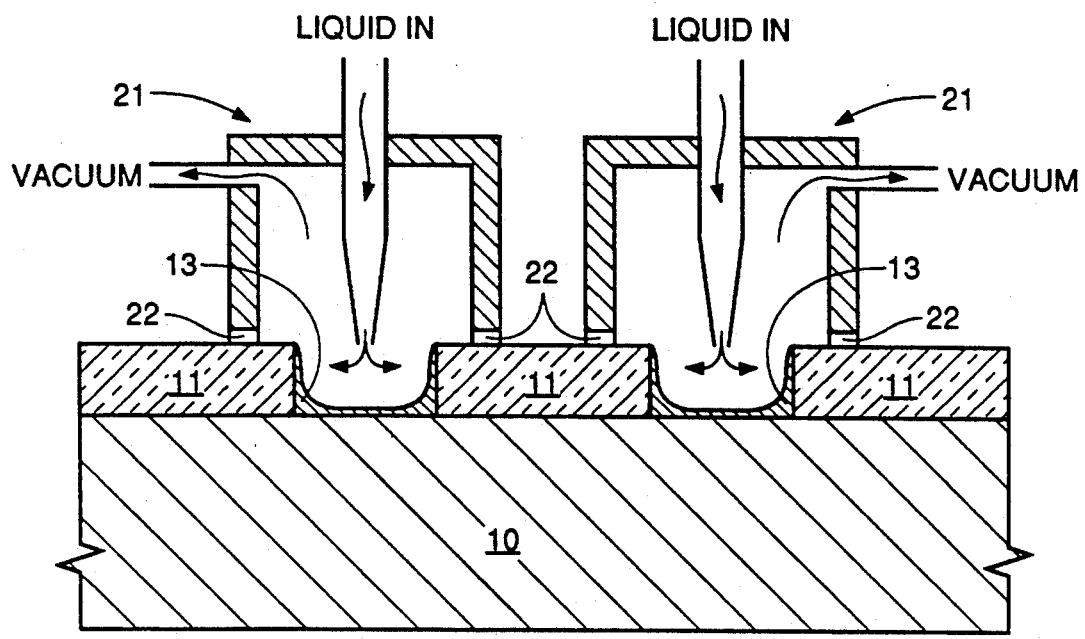

Referring now to FIG. 2, wafer 10 is mounted in a substantially flat alignment (substantially horizontal alignment) in order to prepare for local dispersion of a wet etching agent to remove residue 13. The wet etching agent may comprise such etching agents as, liquid, liquid vapor, gases, etc., known to one skilled in the art.

The wafer surface (in this case overlying layer 11) must be positioned in relation to apparatus 21 such that seal 22 contacts layer 11 and provides a leak proof seal between layer 11 and about the perimeter of seal 22. Now a tungsten etching agent is introduced through etchant dispensing apparatus 21 onto the alignment marks 12 to remove residue 13. Since the alignment mark is normally a few hundred microns in size and there is a large area of unused real estate around the alignment marks the alignment constraints between etchant dispensing apparatus 21 and wafer 10 are not too severe and the tungsten plugs in the live dice are easily protected from the wet etch. The etchant dispensing apparatus 21 is an enclosed unit and as discussed previously, seal 22 at the bottom of the enclosure creates a leak proof seal to the underlying BPSG. Alignment between wafer 10 and etchant dispensing apparatus 21 can be accomplished by optically aligning and robotically maneuvering (mechanically) the wafer into position. Though it is preferred that the wafer is at a 90° angle to the apparatus, the orientation of wafer 10 and apparatus 21 can be in any position desired as long as the surface portion of apparatus 21 comes in contact with the surface of wafer 10 and provides a seal to prevent the wet etching agent from escaping. For example, as long as a seal is maintained, the wafer's upper surface could be positioned downward and apparatus 21 would then make contact from underneath the wafer.

Figure 3:
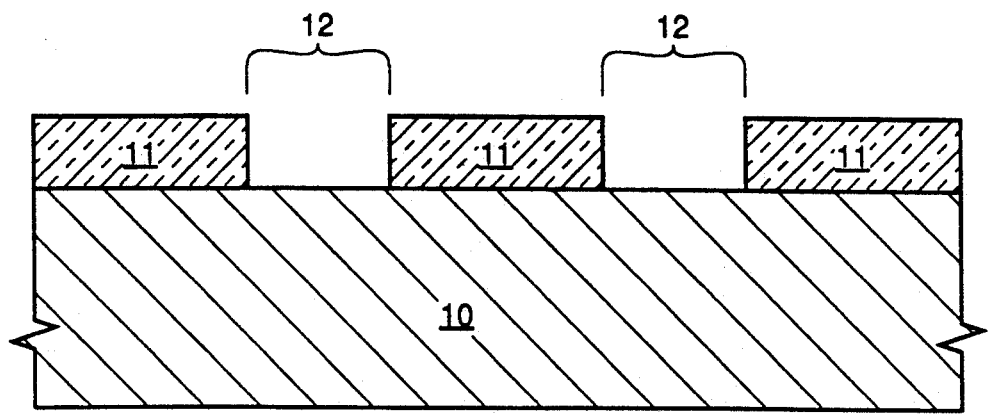
Figure 4:
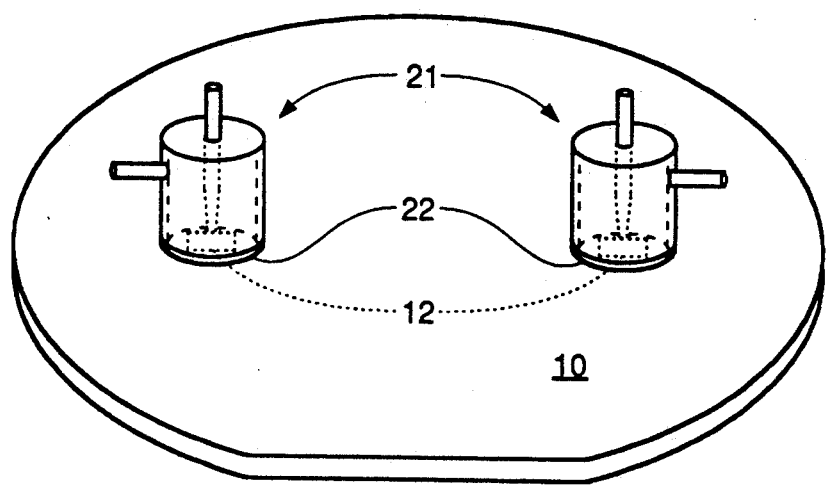
FIG. 4 is a top view showing a localized etchant dispensing apparatus aligned to a wafer and positioned at alignment marks that reside on the wafer.

Referring now to FIG. 3, residue 13 (seen in FIG. 2) has been removed from alignment marks 12 and the resulting etching byproduct is removed by suction. The removal of the etching byproduct may be preformed during the step of etching residue 13 (in situ) by flowing water into the etchant dispensing apparatus after dispersing the etching agent. Once the etching byproduct is removed, wafer 10 is then cleaned by rinsing it with distilled water or other suitable cleaning agents.

Alternately, the selective etching of tungsten in the alignment marks (as disclosed in the steps depicted in FIG. 2) may be performed prior to planarization of the tungsten. Performing the selective etch prior to planarization has an advantage in that planarization removes any contaminants which may be added on the wafer surface during selective wet etching of the alignment mark areas (free from oxide or other particles).

Although the present invention is described several embodiments, it will be apparent to one skilled in the art that changes and modifications, such as selectively etching any material in desired locations using a etchant dispensing apparatus, may be made thereto without departing from the spirit and scope of the invention as claimed.

We claim:

1. A process for selectively removing a material from alignment marks on a wafer during a semiconductor fabrication process, said process comprising the steps of:
   a) aligning said wafer to an etchant dispensing apparatus at said alignment marks;
   b) dispensing a wet etching agent onto said alignment marks via said etchant dispensing apparatus, whereby said wet etching agent chemically removes said material;
   c) removing any etching byproducts resulting from said chemical removal; and
   d) cleaning said wafer.

2. The process of claim 1, wherein said aligning of step "a" comprises aligning said wafer in a substantially perpendicular position in reference to said etchant dispensing apparatus.

3. The process of claim 1, wherein said aligning of step "a" comprises positioning said wafer in relation to said apparatus such that a leak proof seal is formed between said wafer surface and about the perimeter of the wafer contacting surface of said apparatus.

4. The process of claim 1, wherein said aligning of step "a" comprises mechanically aligning said wafer to said etchant dispensing apparatus.

5. The process of claim 1, wherein said aligning of step "a" comprises optically aligning said wafer to said etchant dispensing apparatus.

6. The process of claim 1, wherein said steps "b" and "c" are performed in situ.

7. The process of claim 1, wherein said material comprises refractory metals.

8. The process of claim 7, wherein said refractory metals comprise tungsten.

9. The process of claim 1, wherein said removing etching byproduct resulting from said chemical removal comprises removal by suction.

10. The process of claim 1, wherein said cleaning said wafer comprises rinsing said wafer in distilled water.

11. A process for selectively removing a refractory metal from alignment marks on a wafer during a semiconductor fabrication process, said process comprising the steps of:
   a) aligning said wafer to an etchant dispensing apparatus at said alignment marks;
   b) dispensing a wet etching agent onto said alignment marks via a etchant dispensing apparatus, whereby said wet etching agent chemically removes said refractory metal;
   c) removing any etching byproducts resulting from said chemical removal; and
   d) cleaning said wafer.

12. The process of claim 11, wherein said aligning of step "a" comprises aligning said wafer in a substantially perpendicular position in reference to said etchant dispensing apparatus mounted.

13. The process of claim 11, wherein said aligning of step "a" comprises positioning said wafer in relation to said apparatus such that a leak proof seal is formed between said wafer surface and about the perimeter of the wafer contacting surface of said apparatus.

14. The process of claim 11, wherein said aligning of step "a" comprises mechanically aligning said wafer to said etchant dispensing apparatus.

15. The process of claim 11, wherein said aligning of step "a" comprises optically aligning said wafer to said etchant dispensing apparatus.

16. The process of claim 11, wherein said steps "b" and "c" are performed in situ.

17. The process of claim 11, wherein said refractory metal comprises tungsten.

18. The process of claim 11, wherein said removing etching byproduct resulting from said chemical removal comprises removal by suction.

19. The process of claim 11, wherein said cleaning said wafer comprises rinsing said wafer in distilled water.

20. A process for selectively removing a tungsten from a alignment marks on a wafer during a semiconductor fabrication process, said process comprising the steps of:

a) aligning said wafer in a substantially perpendicular position in reference to an etchant dispensing apparatus at said alignment marks;
b) dispensing a wet etching agent onto said alignment marks via a etchant dispensing apparatus, whereby said wet etching agent chemically removes said tungsten;
c) removing any etching byproducts resulting from said chemical removal; and
d) cleaning said wafer.

21. The process of claim 20, wherein said aligning of step "a" comprises mechanically aligning said wafer to said etchant dispensing apparatus.

22. The process of claim 20, wherein said aligning of step "a" comprises positioning said wafer in relation to said apparatus such that a leak proof seal is formed between said wafer surface and about the perimeter of the wafer contacting surface of said apparatus.

23. The process of claim 20, wherein said aligning of step "a" comprises optically aligning said wafer to said etchant dispensing apparatus.

24. The process of claim 20, wherein said steps "b" and "c" are performed in situ.

25. The process of claim 20, wherein said removing etching byproduct resulting from said chemical removal comprises removal by suction.

26. The process of claim 20, wherein said cleaning said wafer comprises rinsing said wafer in distilled water.

* * * * *